(12) United States Patent
Schurack et al.

(10) Patent No.: US 8,395,284 B2
(45) Date of Patent: Mar. 12, 2013

(54) HIGH-POWER SWITCHING MODULE AND METHOD FOR THE GENERATION OF SWITCHING SYNCHRONISM IN A HIGH-POWER SWITCHING MODULE

(75) Inventors: Johannes Schurack, Berlin (DE); Thomas Trompa, Berlin (DE); Karl Heinz Segsa, Berlin, DE (US); Joachim Mueller, Ahrensfelde (DE)

(73) Assignees: LTB Lasertechnik Berlin GmbH, Berlin (DE); Spree Hybrid & Kommunikationstechnik GmbH, Berlin (DE)

( * ) Notice: Subject to any disclaimer, the term of this patent is extended or adjusted under 35 U.S.C. 154(b) by 859 days.

(21) Appl. No.: 12/301,748

(22) PCT Filed: May 20, 2007

(86) PCT No.: PCT/DE2007/000921
§ 371 (c)(1),
(2), (4) Date: Sep. 4, 2009

(87) PCT Pub. No.: WO2007/134589
PCT Pub. Date: Nov. 29, 2007

(65) Prior Publication Data
US 2010/0148847 A1    Jun. 17, 2010

(30) Foreign Application Priority Data

May 23, 2006    (DE) .......................... 10 2006 024 938

(51) Int. Cl.
*H03K 3/00*    (2006.01)
(52) U.S. Cl. ...................................................... 307/106
(58) Field of Classification Search .................... 307/106
See application file for complete search history.

(56) References Cited

U.S. PATENT DOCUMENTS 4,425,518 A    1/1984    Milberger

FOREIGN PATENT DOCUMENTS

| DE | 234974 | 4/1986 |
|---|---|---|
| DE | 3630775 | 3/1988 |
| DE | 4040164 | 6/1992 |
| DE | 4240647 | 6/1994 |
| DE | 19515279 | 5/1996 |
| DE | 19825056 | 1/2000 |
| DE | 10216707 | 10/2003 |
| DE | 69629175 | 4/2004 |

OTHER PUBLICATIONS

I.V. Grekhov, "High-Power Semiconductor Based Nano and Subnanosecond Pulse Generator With a Low Delay Time,", IEEE Transactions on Plasma Science, vol. 33, No. 4, Aug. 2005, pp. 1240-1244.

*Primary Examiner* — Rexford Barnie
*Assistant Examiner* — Dru Parries
(74) *Attorney, Agent, or Firm* — Leydig, Voit & Mayer, Ltd.

(57) ABSTRACT

A high-power switching module for directly feeding pulse energy to a load includes a plurality of series-connected switching stages. Each switching stage includes a semiconductor switch; a snubber capacitor and a synchronizing resistor; and a control network configured to act on the semiconductor switch and to be supplied with auxiliary power and switching pulses from a pulse driver so as to influence a switching of the semiconductor switch. The control network includes at least one control resistor, a control diode, an auxiliary diode, an auxiliary capacitor configured to decouple and store the auxiliary power so as to maintain an offset voltage at the semiconductor switch, and an adjustable time-delay element series connected to the control diode and connected in parallel with the control resistor. The adjustable time-delay element is configured to variably set the offset voltage for the semiconductor switch that determines the switching of the semiconductor switch.

14 Claims, 4 Drawing Sheets

HIGH-POWER SWITCHING MODULE AND METHOD FOR THE GENERATION OF SWITCHING SYNCHRONISM IN A HIGH-POWER SWITCHING MODULE

CROSS REFERENCE TO PRIOR APPLICATIONS

This application is a U.S. National Phase application under 35 U.S.C. §371 of International Application No. PCT/DE2007/00921, filed May 20, 2007, and claims benefit to German Patent Application No. 10 2006 024 938.0, filed May 23, 2006. The International Application was published in German on Nov. 29, 2007 as WO 2007/134589 under PCT Article 21(2).

FIELD

The present invention relates to a high-power switching module for directly feeding pulse energy to a load with series-connected switching stages that each have a semiconductor switch, as well as a control network that acts on the semiconductor switch and that is supplied with auxiliary power from a pulse driver in order to influence the switching of the semiconductor switch.

BACKGROUND

Many systems used in laser technology, optics, optoelectronics and electronics have to switch load paths at high voltages. The load has to be brought into a low-ohmic state within a very short period of time, preferably less than 10 ns, so that high currents can be fed in or capacitances can be transferred quickly and efficiently. Examples are the gas discharge channel of a transversally electrically excited gas discharge laser, for example, a $CO_2$ laser, used for generating light pulses having a small width, also the control of Pockels cells for light modulation and devices for controlling ion flight paths in time-of-flight mass spectrometers. The switching operations have to take place very quickly and repetition rates of up to several kHz have to be possible. Thus, there is a great need for a sturdy high-power switching module that has a long service life and that allows fast feeding of currents or charging and discharging of capacitors over a wide operating voltage range.

When it comes to using such a high-power switching module in a gas discharge laser, the following performance profile, for example, is desirable:

| | |
|---|---|
| Switching voltage | 5 to 25 kV |
| Safe reverse voltage | 15% above the rated switching voltage |
| Switching time | 5-15 ns |
| Reverse recovery time | max. 5 µs |
| Time jitter switching operation | 0.6 to max. 1.5 ns |
| Repetition frequency | 100 to 2500 pps |
| Peak current (>250 ns) | 1800 to 5500 A |
| Reverse current (>200 ns) | 40% of the peak current |
| Rate of current rise | 120-500 A/ns |

High-power switching modules typically work with a wide array of active elements. In the case of thyratrons filled with hydrogen or deuterium, short switching times at high voltages and currents are achieved. Problematic aspects are the very large physical dimensions and the need for constant heating, which calls for preheating time. Other drawbacks are cathode fatigue and their finite service life due to hydrogen loss.

In high-power switching modules with semiconductor switching systems that are connected on the primary side, the switching operation is carried out at voltages that can be safely controlled with the currently available semiconductor elements (1 to 1.5 kV). A high-frequency pulse driver transforms the switching operation into the required high-voltage range of several 10 kV. A disadvantage here is the finite bandwidth of such pulse drivers, the large installation dimensions, the extremely high currents on the primary side and their poor efficiency. Moreover, the HV pulse still has to be adjusted. Therefore, such switching systems cannot be used for all applications.

Furthermore, high-power switching modules with so-called "plasma semiconductor switches" (Drift Step Recovery Diodes—DSRD—or Fast Ionization Dynistors—FID) have recently become available on the market as single-stage and multi-stage semiconductor switches in special versions (see the publication titled "High Power Semiconductor-Based Nano and Subnanosecond Pulse Generator with a Low Delay Time" by I. V. Grekhov et al. in IEEE Transactions on Plasma Science, Vol. 33, No. 4, August 2005, pp. 1240-1244). However, there is not yet any substantiation of the reliability and service life of these semiconductor switches, and this currently still stands in the way of using them in industrial products. Fundamentally, these elements cannot be switched off, as a result of which they are not suitable for a number of applications.

Typically, directly switching power modules with bipolar and unipolar switching transistors as well as IGBTs are the most frequently used. The current and voltage ranges that are under consideration in conjunction with the present invention, however, so far call for the series-connection and parallel-connection of several hundred elements. Consequently, in order to compensate for element tolerances, symmetrizing networks are necessary. Above about 300 elements, however, the properties of these symmetrizing networks (limitation of the dynamics, tolerances, power loss) mean that the properties of the semiconductor switches are not fully utilized. The switching speed or current rise speed of a switching module structured in this manner can no longer be increased, the power loss of such systems reaches uneconomical levels.

With typical high-power switching modules, sufficiently high voltages in the range of several 10 kV and switching times of less than 20 ns are only achieved by serially connecting many individual switches (see U.S. Pat. No. 4,425,518). However, the individual switches have to be actuated time-synchronously to the greatest extent possible, as is done in DE 36 30 775 C2 by a stepped transformer. In order to increase the permissible current, a matrix arrangement comprising many circuit breakers is also known (see DE 696 29 175 T2). They can only reliably control currents up to a few 100 A. for purposes of achieving a uniform distribution of the voltage among the individual stages in the case of somewhat different active elements operating at high voltages in the limit ranges of the elements, DD 234 974 A1 describes connecting a chain of resistors in parallel to the switching stages. DE 198 25 056 C1 describes a circuit arrangement for feeding electric energy into the plasma of a glow discharge with a specially interconnected p-type conducting and n-type conducting MOSFET output stage as the driver for a high-power IGBT, so that the power of unipolar or bipolar pulsed plasmas can be increased.

DE 36 30 775 C2 describes a high-power switching module in which several switching stages each have a MOSFET as the semiconductor switch. All of the semiconductor switches are series-connected with their anode and cathode terminals. A control network for the semiconductor switch is provided in each switching stage and this control network is located between the control terminal and a pulse driver equipped with a primary winding and with a number of secondary windings corresponding to the number of switching stages provided. Without this control network, the switching duration of the known high-power switching module is predefined by the voltage-time frame of the pulse driver and it is in the order of magnitude of 100 ns. In order to achieve slightly longer switching durations, the control network has a control diode that is polarized in the conducting direction relative to the induced control voltage, and it also has a control resistor that is connected between the control terminal and the anode terminal of the semiconductor switch. Consequently, in a typical high-power switching module, the control network serves for purposes of possibly prolonging the switching duration as a function of a permanently set control resistance in each switching stage.

Another high-power switching module is described in DE 195 15 279 C2. In this generic high-power switching module, a snubber capacitor and an additional synchronizing resistor (there as a varistor) are connected in parallel to each semiconductor switch between the anode terminal and the cathode terminal. Snubber networks neutralize interfering oscillations or voltage peaks. The high-frequency voltage peaks that arise from the bouncing of the contacts of the semiconductor switch are short-circuited by a snubber capacitor. If switching pulses are induced into the switching stage by the pulse driver, then these switching pulses reach the control terminal of the semiconductor switch via the control diode, they charge its snubber capacitor and the semiconductor switch switches on. As the pulse amplitude subsides, the control diodes, which are then non-conductive, prevent a charge balancing in the snubber capacitor via the pulse driver, so that the snubber capacitor is only discharged via the parallel-connected control resistor. Therefore, the switching duration can be set by the value of the control resistance.

However, with this high-power switching module as well as with all of the above-mentioned high-power switching modules, there is always a fixed association of each switching stage to an operating point at a fixed switching stage voltage. Consequently, element tolerances and operational fluctuations only allow a switching synchronism of between 3 ns and 5 ns at best. However, if individual switching stages switch on sooner than others because of operating point shifts, responses to temperature changes or interference coupling, this can lead to the destruction of all of the semiconductor switches in the high-power switching module. This equally applies to turn-off operations. If an active turn-off operation is carried out, this necessarily has to be done synchronously, since otherwise the voltage at the switching stage that switches first will rise impermissibly and the switching stage will be destroyed.

The switching synchronism in a high-power switching module is determined by the turn-on and turn-off time constants (turn on delay, turn off delay) of the individual switching stages. These, in turn, are influenced by the element parameters, for example, the snubber capacitance, the switching level, the amplification, the linearity and the positive feedback. Additional influences are also the switch periphery such as the control level, the source resistance, the anode voltage and cathode voltage, the load capacitance and load inductance as well as the responses to temperature changes. With typical high-power switching modules, differences in the switching times of the individual semiconductor switches are compensated for by internal positive feedback effects and limited by external protective circuits. Due to the nevertheless still highly varying turn-on and turn-off time constants of the individual switching stages, however, no switching synchronism can be achieved in the lower ns range with the prior-art high-power switching modules.

SUMMARY

Therefore, an aspect of the present invention is to provide a generic high-power switching module that, even under extreme operating conditions, provides a high switching synchronism below 1.5 ns for the switching stages during turn-on and turn-off operations over a wide range of voltages and temperatures.

In an embodiment, the present invention provides a high-power switching module for directly feeding pulse energy to a load including a plurality of series-connected switching stages. Each switching stage includes a semiconductor switch having an anode, a cathode, and a control terminal; a snubber capacitor and a synchronizing resistor connected in parallel with the anode and cathode of the semiconductor switch; and a control network configured to act on the semiconductor switch and to be supplied with auxiliary power and switching pulses from a pulse driver so as to influence a switching of the semiconductor switch. The control network includes at least one control resistor, a control diode polarized in a conducting direction of the switching pulses, an auxiliary diode polarized in a non-conducting direction of the switching pulses, an auxiliary capacitor configured to decouple and store the auxiliary power so as to maintain an offset voltage at the semiconductor switch, and an adjustable time-delay element series connected to the control diode and connected in parallel with the control resistor. The adjustable time-delay element is configured to variably set the offset voltage for the semiconductor switch that determines the switching of the semiconductor switch.

BRIEF DESCRIPTION OF THE DRAWINGS

The high-power switching module according to the present invention and a method for the generation of switching synchronism in such a high-power switching module are explained by way of example in greater depth below in embodiments making reference to the drawings, in which.

DETAILED DESCRIPTION

Figure 1:
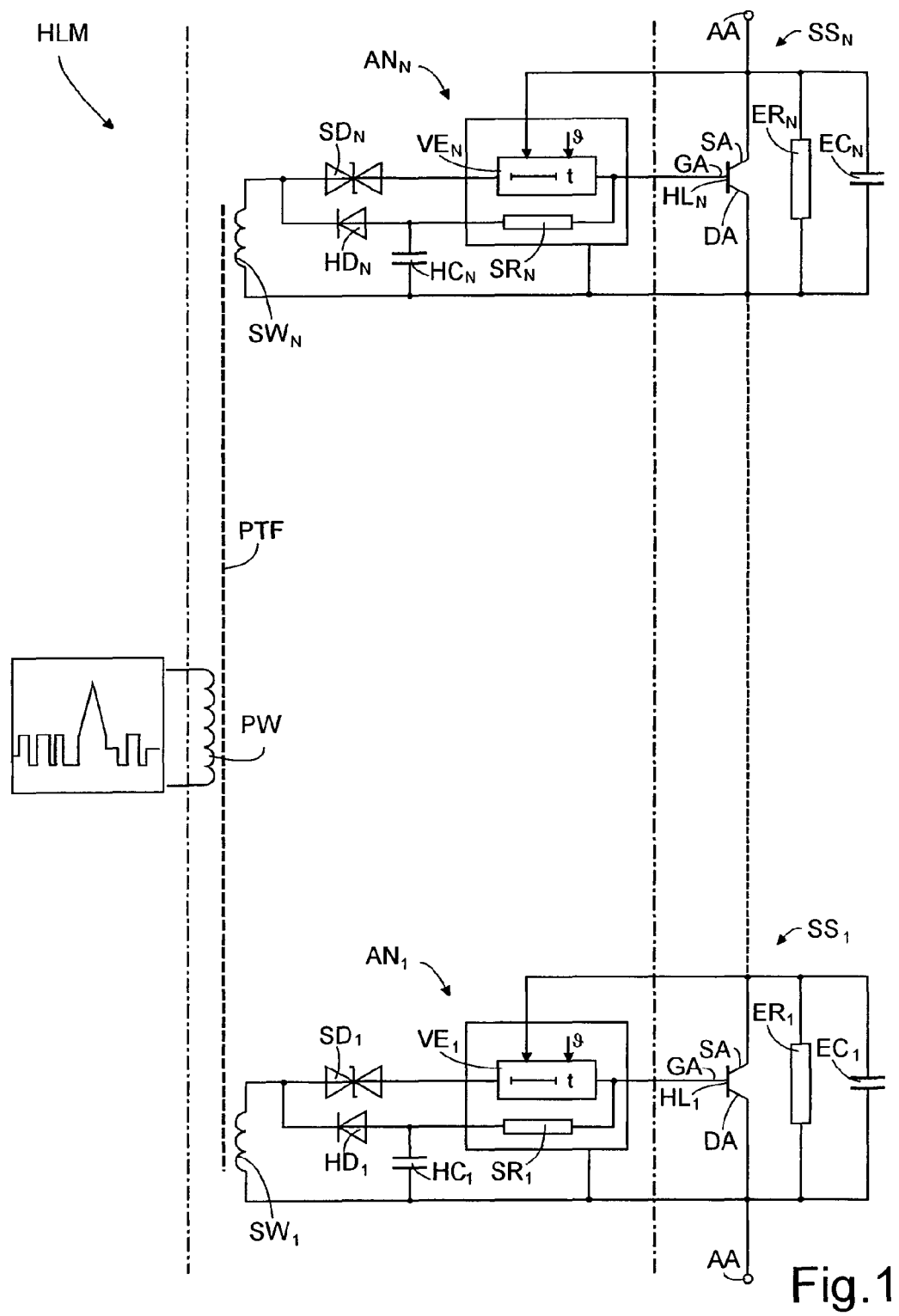
FIG. 1 is a circuit diagram of the high-power switching module in accordance with an embodiment of the present invention.

In an embodiment, the turn-on and turn-off time constants of all of the switching stages are brought to the same values in the ns range and also maintained under these extreme operating conditions. An embodiment is easy to handle, sturdy during operation and cost-effective to purchase.

The high-power switching module according to an embodiment of the present invention includes, in each switching stage, the timing of the operating point, that is to say, the actual switching event, is variably adjustable, as a function of the individual circumstances. This variable adjustability is based on the fundamental realization that, with the cascading of modern elements that is found in parallel switching stages, their maximum possible switching times (turn-on and turn-off operations) can be utilized if the switching instants are shifted into a shared time window.

In order to shift the switching instants in a manner that is individual for each switching stage, the control network has an adjustable time-delay element that is series-connected to the control diode and parallel-connected to the control resistor and, with this time-delay element, an offset voltage that is individual for each switching stage can be set at the semiconductor switch for purposes of variably setting its turn-on and turn-off points. With the time-delay element, the following effects can be compensated for in the high-power switching module according to an embodiment of the present invention:

individual tolerances of the switching delay time among the individual semiconductor switches, due to
limitations of reproducibility of the internal semiconductor structures that are reflected in the tolerance field of the switching delay time
tolerances in the interaction between the control electronics and the control terminal of the semiconductor switch by means of snubber capacitors and response thresholds
systematic temperature-dependent deviations caused by a known temperature gradient between the individual switching stages, i.e. the provided heat sink does not function absolutely uniformly at each switching stage
individual tolerance of the cathode voltage/collector voltage/anode voltage of each switching stage, due to inaccuracies in the symmetrizing network of synchronizing resistors
possibly individual scattering of the dependencies between the switching delay time and the anode voltage or temperature.

With the high-power switching module according to an embodiment of the present invention, the turn-on and turn-off duration of all of the other semiconductor switches is systematically delayed as a function of the very slowest semiconductor switch during the turn-on and turn-off operations in such a way that all of the semiconductor switches switch within a very narrow time window of less than 1.5 ns. Moreover, in accordance with an embodiment of the present invention, so that each semiconductor switch switches with a time delay, an auxiliary diode polarized in the non-conducting direction relative to incoming switching pulses and an auxiliary capacitor for decoupling and storing auxiliary power are used at the semiconductor switch, in order to hold the offset voltage that is individual for each switching stage.

Since the turn-on and turn-off times of the semiconductor switches currently cannot be reduced to less than 1 ns and since large element deviations occur due to the delay of the turn-on and turn-off durations, the end points of the turn-on and turn-off operations that result in a completely switched-on or switched-off semiconductor switch are moved into a very narrow time window of less than 1.5 ns, so that the high switching synchronism is obtained for the switched-on state as well as for the switched-off state. Consequently, due to the high switching synchronism achieved during the turn-on and turn-off operations, the switching time (rise time) of the high-power switching module can be significantly increased in comparison to typical modules. Through these measures, the pulse energy can be switched efficiently that 10 to a maximum of 20 high-power elements already provide the performance profile needed for most applications. In comparison to typical approaches using up to 300 semiconductor switches, this accounts for a marked reduction in the number of semiconductor switches required and thus in the costs.

In order to achieve the high switching synchronism, an individual offset voltage is preset on the semiconductor switch of each switching stage in the high-power switching module according to the invention employed in an active or passive control network. Since the individual turn-on and turn-off times of the semiconductor switches depend on the continuous and instantaneous operating conditions in each switching stage, the control network has a time-delay element by means of which the offset voltage that is individual for each switching stage can be continuously set within a sufficiently broad range by means of a different time-delay. Depending on the particular case, this time-delay element can have a passive compensation loop or an active control loop as well as measuring devices for measuring the instantaneous switching stage voltage and the instantaneous switching stage temperature.

As additional measures for optimizing the switching synchronism, a snubber capacitor and an additional synchronizing resistor in parallel to the semiconductor switch between the anode terminal and the cathode terminal. The parallel-connected snubber capacitors ensure a dynamic voltage distribution during the switching phase and feed the semiconductor switches so that they are in the safely switched state. It is possible to effectively suppress the negative effect of incoming line inductances that, due to transient phenomena, cause the holding current of the switching stages to fall below the requisite value. The synchronizing resistors connected in parallel to the semiconductor switch in each switching stage ensure a uniform distribution of the voltage among all of the switching stages.

In a modification of the high-power switching module according to an embodiment of the present invention, it can be provided that the switch-on diode is conductive for prescribed offset voltage values, also in the non-conducting direction relative to incoming switching pulses. A switch-on diode that is conductive on both sides in a voltage-dependent manner, can, on the one hand, safely conduct the switching current required for the switching operation of the semiconductor switch as well as prevent a reverse current and, on the other hand, it can also conduct a smaller current in the opposite direction that serves, for example, for monitoring purposes. This is likewise discussed in greater detail in the embodiments of the method according to the invention.

Another modification packet of the high-power switching module according to an embodiment of the present invention deals with its operating temperature. The instantaneous temperature in the individual switching stages has an influence on the switching behavior of the semiconductor switches and thus on the setting of the offset voltage that is individual for each switching stage or on the setting of the time-delayed switching time. Thus, care must be taken to ensure a good temperature equalization between the individual switching stages and, all in all, to keep the temperature of all of the switching stages constant to the greatest extent possible. This is why it is advantageous for the individual switching stages to be arranged on a shared support made of a base material having a very high thermal conductivity. This is preferably an industrial ceramic material, for example, aluminum oxide or aluminum nitride. Many industrial ceramics with very high thermal conductivity coefficients are known from the state of the art. Thick-layer technology lends itself for the elements contained in the passive network. This technology allows the construction of auto-compensating circuits, affords precise balancing possibilities and provides high reliability.

In terms of its structural design, the high-power switching module can be configured to be planar, i.e. two-dimensional in a plane, or spatial, i.e. three-dimensional in space. Here, the structure ensures a minimum temperature gradient (below 10 K) between the switching stages, ideal power loss dissipation (several 100 Watt), minimum space requirements and, associated with this, a small component inductance. This is advantageous in view of the switching times in question. With the planar configuration, all of the switching stages are arranged on a shared support. This allows an ideally adapted geometry and a high dielectric strength and stability. With the spatial configuration, one switching stage or a group of switching stages is/are associated with its/their own support. All of the supports are then inserted above each other or next to each other into a frame made of a material having a high thermal conductivity. In order to ensure temperature compensation between the individual supports, the frame is preferably made of an electrically conductive or electrically insulating material. This can be, for example, a metal frame. The frame can be thermally coupled to a cooling device of the load so that the heat load that occurs can be easily dissipated. The cooling device can be, for example, the cooling collector of a gas discharge laser.

The placement of the elements on a shared support in a single process, coupled with the active balancing of the individual switching stages by individually setting the offset voltage in the high-power switching module according to an embodiment of the present invention allows narrow element tolerances and a high synchronous operation (TK, voltage dependence, etc.).

It was already explained above that, due to individual operating conditions, the turn-on and turn-off times of a high-power switching module cannot be reduced to less than 1 ns. These are already ultra-short switching times, but they only yield switching windows of 3 ns to 5 ns. The high-power switching module described in DE 36 30 775 C2 still has a switching time of 100 ns, but it is already twenty years old. However, since, in order to generate ultra-short light pulses (in the ps range) with a gas discharge laser, for example, it is important for all of the stored energy of the high-power switching module to be released within a very narrow time window—preferably a width of 800 ps—and also since the turn-off operation takes place in such a narrow time window so that a high pulse frequency rate can be achieved, the high-power switching module according to an embodiment of the present invention is based on the notion of individually setting the switching time of each semiconductor switch and of trimming it to a time window of less than 1.5 ns.

Thus, a method for the generation of switching synchronism in a high-power switching module of the described type is characterized in that, in each switching stage, stored auxiliary power is used at the semiconductor switch to set an offset voltage that is individual for each switching stage in order to delay the switching time, the value of said offset voltage being determined as a function of the total switching stage capacitance, of the instantaneous switching stage voltage and of the instantaneous switching stage temperature in such a way that the semiconductor switches of all of the switching stages are switched on after a switching pulse has been received within a time window $\leq 1.5$ ns. Here, in each switching stage, the auxiliary power is branched off from the pulse driver by means of an alternating current superimposed onto the switching pulses of the pulse driver. With this method, in each switching stage, the momentary switching conditions of the semiconductor switch are individually determined and taken into account in that an individual offset voltage with the effect of a delaying bias voltage is set on the semiconductor switch.

Here, the offset voltage is preferably set as the basic value (statically) relative to the total switching stage potential, and as an instantaneous value (dynamically) relative to the instantaneous switching stage voltage and to the instantaneous switching stage temperature in a passive compensation loop, of the type well-known from measuring technology, or else in an active control loop. The requisite active control element then draws its power from the auxiliary power made available in the switching stage. The switching time constant of each stage (turn on delay, turn off delay) is determined by the snubber capacitance, the switching level, the amplification, the linearity and the positive feedback of the high-power element. Tolerances in these parameters, even in the case of exactly harmonized driver pulses, lead to different switching instants. With an embodiment of the present invention, the tolerances are compensated for via an individually adjustable basic offset value. In addition to this, there are the influences of the switch periphery such as the control level, the source resistance, the anode voltage and the cathode voltage, the load capacitance and the load inductance as well as the responses to temperature changes in each stage. According to an embodiment of the present invention, the delay shifts of each switching stage that depend on the instantaneous operating conditions are impressed upon the basic offset value in such a way that a switching time window of <1.5 ns is obtained and remains over all of the switching stages.

Finally, according to an aspect of the present invention, it can also be advantageously provided that, by means of a comparison to a prescribed limit value, the offset voltage that is individual for each switching stage is simultaneously used to monitor the function of each switching stage and in linked form, to release the driver circuit. Consequently, by repeatedly determining the offset voltage, control functions can also be performed to ensure the operating safety of the entire high-power switching module. This assumes prescribed minimum and maximum limit values between which the set offset voltage may lie. Values outside of these limit values indicate in the direction of a faulty switching stage. However, if the set offset voltage is within the permissible range, then it can be forwarded to the driver via the switch-on diode that is then correspondingly partially conductive in both directions. In this manner, it can be ensured that the switching stages are only switched when safe operating conditions are present. In case of deviations, an error signal is generated and/or the switching pulse is blocked, as a result of which secondary failures are prevented.

FIG. 1 shows a high-power switching module HLM according to an embodiment of the present invention for the direct feed of pulse energy to a load. The load can be a transversally electrically excited gas discharge laser for generating ultra-short light pulses. The energy feed needed for the light amplification is obtained here from a high-current discharge at 1000 to 14,000 A cm$^{-2}$ crosswise through the active laser volume. Due to the high-current discharge, a plasma is ignited in the gas discharge gap. The high-current discharge is fed, for example, from low-inductance capacitors in which electric energy is temporarily stored during the laser pulse pauses. Via the high-power switching module HLM, the temporarily stored energy is guided at a rate of current rise of, for example, 100,000 A/µs, into the laser volume in order to ignite the plasma. (e.g. LTB MNL 100)

The high-power switching module HLM consists of a number N of switching stages $SS_N$, for example, N=1 to 10 up to a maximum of 20, that each have a semiconductor switch $HL_N$ with an anode terminal SA (also source terminal or anode terminal), a cathode terminal DA (also sink terminal or cathode terminal) and a control terminal GA (control). The semiconductor switch HL can be a MOS-controlled thyristor (MCRT) or an SMCT. A snubber capacitor $EC_N$ and a synchronizing resistor $ER_N$ are connected in parallel to each semiconductor switch $HL_N$ between the anode terminal SA and the cathode terminal DA. All of the semiconductor switches $HL_N$ are series-connected to their anode terminals SA and cathode terminals DA. The load is connected to external terminals AA. Moreover, each high-power switching module HLM has a control network $AN_N$ to individually set the turn-on and turn-off instants of each semiconductor switch $HL_N$ by means of an offset voltage. Via the control network $AN_N$, each switching stage $SS_N$ is connected to a pulse driver PTF as a trigger source. Said pulse driver has a primary winding PW that is common to all of the switching stages $SS_N$ and with which a secondary winding $SW_N$ is associated for each switching stage $SS_N$. Thus, all of the switching stages $SS_N$ can be jointly supplied by the pulse driver PTF.

Each control network $AN_N$ in each switching stage $SS_N$ has a control diode $SD_N$ as a potential barrier via which only a sufficiently large switching pulse of the pulse driver PTF is conducted to the semiconductor switch $HL_N$. Series-connected to the control diode $SD_N$ is a time-delay element $VE_N$ via which an offset voltage is set on the semiconductor switch $HL_N$ and thus its switching time is set over wide ranges as a function of the instantaneous ambient conditions (see FIG. 2 for the setting of the offset voltage). Another control resistor $SR_N$ is arranged parallel to the control diode $SD_N$ as well as to the time-delay element $VE_N$. The set offset voltage is safely held in the non-conductive state on the semiconductor switch $HL_N$ by an auxiliary power that is stored in an auxiliary capacitor $HC_N$. The auxiliary power is branched off from the pulse driver PTF via an auxiliary diode $HD_N$. For this purpose, said pulse driver PTF is energized with a small alternating voltage, having, for example, a sine-wave, triangular or rectangular form, that is superimposed on the triggering of the switching pulses (potential difference of several 10 kV) and on the pulse driver PTF (see insertion in FIG. 1).

Figure 2:
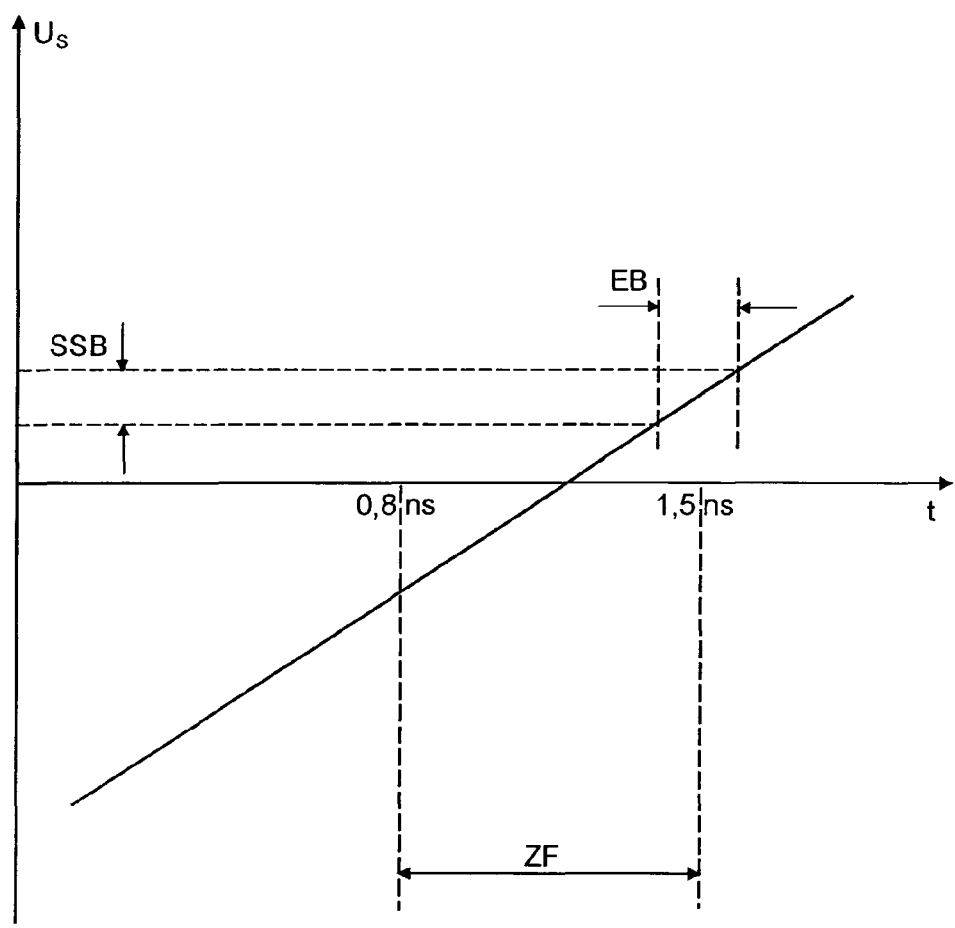
FIG. 2 is a control voltage curve of a semiconductor switch in accordance with an aspect of the present invention.

FIG. 2 depicts a schematic diagram showing the setting behavior of each semiconductor switch $HL_N$ in each switching stage $SS_N$ (only the turn-on operation is shown; however, this applies analogously to the turn-off operation, except here it is with a declining straight control line). The control voltage $U_S$ is plotted over the time t. The semiconductor switch $HL_N$ has a linear switching behavior. The area with the broken line shows the safe switching range SSB of each semiconductor switch $HL_N$. This range has to be reached by all of the semiconductor switches $HL_N$ of the high-power switching module HLM within a time window ZF of 1.5 ns at the maximum (a minimum width of only about 600 ps to 800 ps is the objective). Depending on the operating state of the individual switching stage $SS_N$, however, the semiconductor switches $HL_N$ have a different switching duration. In order for all of the semiconductor switches $HL_N$ to switch synchronously, first of all, the slow semiconductor switch $HL_N$ is ascertained. All of the other, faster semiconductor switches $HL_{N-1}$ are then delayed relative to this semiconductor switch $HL_N$ according to their own switching durations in that an offset voltage is set. The faster the semiconductor switch $HL_{N-1}$, the higher the preset offset voltage has to be, and the greater the delay that is achieved. All of the semiconductor switches $HL_N$ can be preset within a setting range EB up to a maximum offset voltage and thus with a maximum delay. If higher offset voltages are required, this indicates a malfunction of the semiconductor switch $HL_N$.

For one thing, the offset voltage to be set depends on the element parameters in the individual switching stage $SS_N$. This is a basic value that leads to a first offset voltage. Moreover, instantaneous operating states are superimposed at the semiconductor switch $HL_N$. These are the instantaneous switching stage voltage and the instantaneous switching stage temperature. These two values, which are measured with appropriate measuring devices, are superimposed with the basic value of the offset voltage. Both values then lead to an individual and time-dependent presetting of each semiconductor switch $HL_N$. In the switched-off state, the semiconductor switch $HL_N$ is kept in the safe non-conductive range by using auxiliary power. After the triggering of a switching pulse, all of the semiconductor switches $HL_N$ then switch individually, as a result of the additional delay, with such a duration that they reach their safe switching range SBB (for switching on and switching off) within the prescribed shared time window ZF of less than 1.5 ns. As a result, an especially high current rise can be achieved with the high-power switching module HLM according to the invention.

Figure 3:
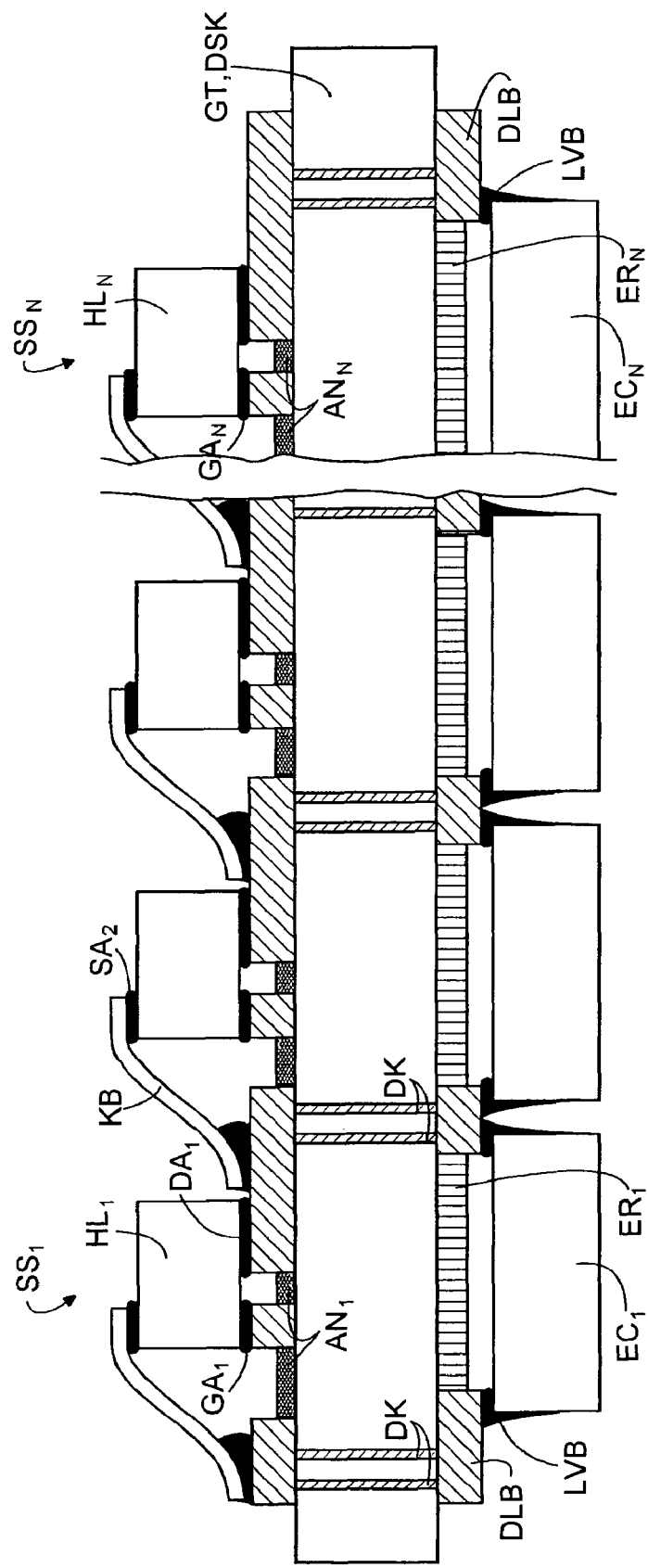
FIG. 3 is a cross section through a planar high-power switching module in accordance with an embodiment of the present invention.
Figure 4:
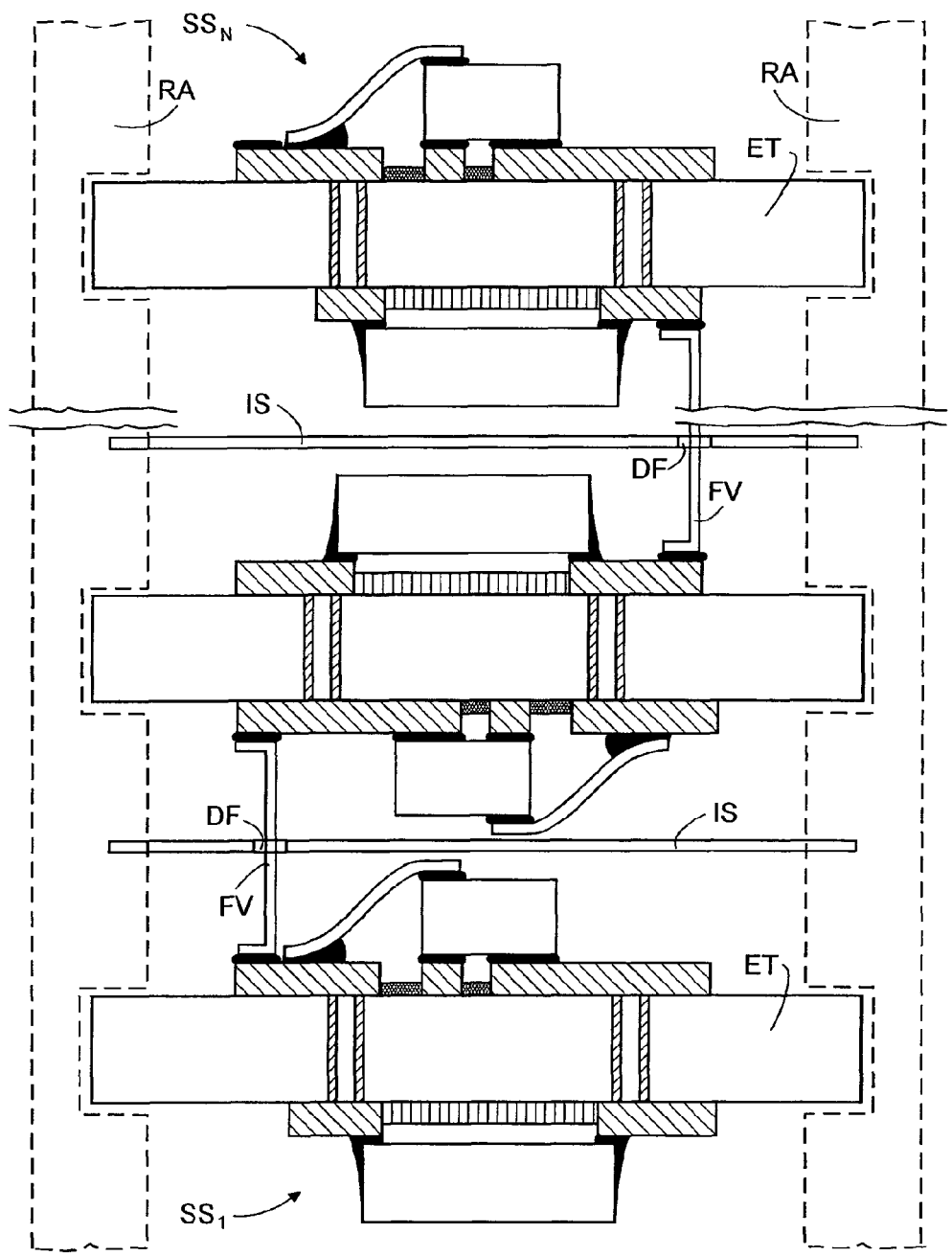
FIG. 4 is a cross section through a spatial high-power switching module in accordance with an embodiment of the present invention.

FIGS. 3 and 4 show the high-power switching module HLM according to an embodiment of the present invention in a planar configuration (FIG. 3) and in a spatial configuration (FIG. 4).

In the planar configuration according to FIG. 3, all of the switching stages $SS_N$ (wherein N is from 1 to i with i switching stages $SS_i$ being provided) are arranged on a shared support GT. In the embodiment shown, this is a thick-layer ceramic (DSK). The semiconductor switches $HL_N$ are located on the top of the shared support GT. The cathode terminals $DA_N$ are series-connected to the anode terminals $SA_N$ of adjacent semiconductor switches $HL_N$ via contact bridges KB. On the bottom of the semiconductor switches $HL_N$, the control terminals $GA_N$ are connected to the control networks $AN_N$. The circuit of the individual control networks $AN_N$ can be seen in FIG. 1. Moreover, the snubber capacitors $EC_N$ and the synchronizing resistors $ER_N$ are connected to the anode terminals $SA_N$ and cathode terminals $DA_N$ via plated-through holes DK, thick-layer circuit-board conductors DLB and electrically conductive soldered connections LVB, and thus they are connected in parallel to the semiconductor switches $HL_N$. In order to achieve a low inductance, the synchronizing resistors $ER_N$ have a special shape.

The spatial configuration according to FIG. 4 differs from the configuration according to FIG. 3 in that, in the selected embodiment, a switching stage $SS_N$ is arranged on one single support ET (it is also possible to have the planar arrangement of several switching stages $SS_N$ on a shared support GT, a number of which are then provided in the form of an individual support ET). Here, every other support ET is arranged upside-down in the selected embodiment, so that simple series contacting is possible. This contacting is created by means of flex connectors FV. In order to avoid short circuits, insulation disks IS with openings DF are provided between the individual switching stages $SS_N$ for the flex connectors FV. The insulation disks IS—like the supports GT, ET—can preferably be made of a ceramic material. All of the individual supports ET are inserted in parallel above each other or next to each other—depending on the viewing angle—into a frame RA that is made of a material that conducts heat well. This can be, for example, a metal frame. It can also be connected to a cooling device, for example, of the load. However, the frame RA can also be made of an electrically insulating material.

While the invention has been particularly shown and described with reference to preferred embodiments thereof, it will be understood by those skilled in the art that various changes in form and details may be made therein without departing from the spirit and scope of the invention.

| List of reference letters | |
|---|---|
| AA | external terminal |
| AN | control network |
| DA | cathode terminal |
| DF | opening |
| DK | plated-through hole |
| DLB | thick-layer circuit-board conductors |
| DSK | thick-layer ceramic |
| EB | setting range of the time delay |
| EC | snubber capacitor |
| ER | synchronizing resistor |
| ET | individual support |
| FV | flex connector |
| GA | control terminal |
| GT | shared support |
| HC | auxiliary capacitor |
| HD | auxiliary diode |
| HL | semiconductor switch |
| HLM | high-power switching module |
| IS | insulation disk |
| KB | contact bridge |
| LVB | electrically conductive soldered connection |
| N | number SS (index) |
| PTF | pulse driver |
| PW | primary winding |
| RA | frame |
| SA | anode terminal |
| SD | control diode |
| SR | control resistor |
| SS | switching stage |
| SSB | safe switching range HL |
| SW | secondary winding |
| VE | time-delay element |
| ZF | time window |

The invention claimed is:

1. A high-power switching module for directly feeding pulse energy to a load, comprising:
a plurality of series-connected switching stages, each switching stage comprising:
a semiconductor switch having an anode, a cathode, and a control terminal;
a snubber capacitor and a synchronizing resistor connected in parallel with the anode and cathode of the semiconductor switch; and
a control network configured to act on the semiconductor switch and to be supplied with auxiliary power and switching pulses from a pulse driver so as to influence a switching of the semiconductor switch,
the control network including at least one control resistor, a control diode polarized in a conducting direction of the switching pulses, an auxiliary diode polarized in a non-conducting direction of the switching pulses, an auxiliary capacitor configured to decouple and store the auxiliary power so as to maintain an offset voltage at the semiconductor switch, and an adjustable time-delay element series connected to the control diode and connected in parallel with the control resistor,
the adjustable time-delay element being configured to variably set the offset voltage for the semiconductor switch that determines the switching of the semiconductor switch.

2. The high-power switching module as recited in claim 1, wherein the adjustable time-delay element includes one of a passive compensation loop and an active control loop.

3. The high-power switching module as recited in claim 2, wherein the adjustable time-delay element includes at least one measuring device for measuring an instantaneous switching stage voltage and an instantaneous switching stage temperature.

4. The high-power switching module as recited in claim 2, wherein the control diode is conductive in the non-conducting of the switching pulse for at least one prescribed offset voltage.

5. The high-power switching module as recited in claim 3, wherein the control diode is conductive in the non-conducting of the switching pulse for at least one prescribed offset voltage.

6. The high-power switching module as recited in claim 1, wherein the high-power switching module is in a planar configuration with the plurality of switching stages being disposed on shared support including a base material having high thermal conductivity.

7. The high-power switching module as recited in claim 1, wherein the high-power switching module is in a spatial configuration with at least one of the plurality of switching stages being disposed on a respective single support including a base material having high thermal conductivity, wherein each respective single support is disposed adjacent to another respective single support on a frame including a material having high thermal conductivity.

8. The high-power switching module as recited in claim 7, wherein the frame includes at least one of an electrically conductive and an electrically insulative material.

9. The high-power switching module as recited in claim 7, wherein the frame is thermally coupled to a cooling device of the load.

10. The high-power switching module as recited in claim 6, wherein the base material includes an industrial ceramic.

11. The high-power switching module as recited in claim 6, wherein the base material includes a circuit employing thick layer technology for each of the plurality of switching stages.

12. A method for generating synchronized switching in a high-power switching module for directly feeding pulse energy to a load, the high-power switching module including a plurality of series-connected switching stages, each switching stage including a semiconductor switch having an anode, a cathode, and a control terminal; a snubber capacitor and a synchronizing resistor connected in parallel with the anode and cathode of the semiconductor switch; and a control network configured to act on the semiconductor switch and to be supplied with auxiliary power and switching pulses from a pulse driver so as to delay a switching of the semiconductor switch, the control network including at least one control resistor and a control diode polarized in a conducting direction of the switching pulses, the method comprising the steps of:
determining a respective value of a respective offset voltage for each switching stage as a function of a total switching stage capacitance, an instantaneous switching stage voltage, and an instantaneous switching stage temperature so that all of the semiconductor switches are switched within 1.5 ns after a switching pulse has been received;
branching off auxiliary power from the pulse driver via an alternating current superimposed onto the switching pulse of the pulse driver; and
using the auxiliary power to set the respective offset voltage for each switching stage.

13. The method for generating synchronized switching in a high-power switching module as recited in claim 12, wherein the respective offset voltage is a basic value relative to a switching instant and as an instantaneous value relative to the instantaneous switching stage voltage and to the instantaneous switching stage temperature in at least one of a passive compensation loop and an active control loop.

14. The method for generating synchronized switching in a high-power switching module as recited in claim 12, wherein the respective offset voltage is used to monitor a function of the respective switching stage and to trigger the switching pulses supplied by the pulse driver.

* * * * *